April 30, 1963 J. S. HAMLIN 3,087,402

HEAT DISSIPATING PHOTOGRAPHIC APPARATUS

Filed June 23, 1960

INVENTOR
JAMES SAMUEL HAMLIN

BY Weston B. Wardell Jr.

ATTORNEY

United States Patent Office 3,087,402
Patented Apr. 30, 1963

3,087,402

HEAT DISSIPATING PHOTOGRAPHIC APPARATUS

James Samuel Hamlin, Merchantville, N.J., assignor to E. I. du Pont de Nemours and Company, Wilmington, Del., a corporation of Delaware Filed June 23, 1960, Ser. No. 38,380
6 Claims. (Cl. 95—73)

This invention relates to devices useful in conjunction with high-intensity radiation exposure devices. More particularly, this invention relates to such devices which are useful during the exposure of flat and curved light-sensitive photopolymerizable layers.

It is known to use high-intensity carbon arc and mercury vapor lamps to expose light-sensitive surfaces to form printing plates in the graphic arts field. This is particularly the case where plastic elements composed of photopolymerizable compositions are exposed to form printing plates. It is, of course, well known that such high-intensity radiation sources are also very rich in infra-red or heat radiation. In the past, the large amount of heat to which the elements are subjected during the exposure step has damaged the elements. In addition, when a photographic negative is used to prepare the light-sensitive plate, damage may be done to the negative thereby making it useless for preparing other plates. This is because such negatives are usually made from lithographic films which have as the light-sensitive layer, a gelatino silver halide emulsion layer. Upon exposure to the original subject matter and development, a silver negative image is obtained. Metallic silver is very absorptive of infra-red radiation. As infra-red radiation is absorbed by the silver, the temperature of the gelatin layer is raised until a temperature is reached at which the gelatin deteriorates. This results in degradation of the negative image and warping of the photographic negative. Heat is also passed by conduction to its surroundings, i.e., to the element being exposed.

When using the photopolymerizable elements mentioned above and fully described in Plambeck U.S. Patents 2,760,863 and 2,791,504, and Martin et al. U. S. Patent 2,927,022, and assignee's Burg U.S. Serial No. 750,868, filed July 25,1958, now Patent No. 3,036,913, difficulty is encountered in maintaining contact between the negative and the surface of the photopolymerizable element, even under the high-vacuum conditions of the conventional lithographic exposure printing frame. Even more troublesome is the fact that during exposure of the above elements the temperature at the surface of the plate may be as high as 150° F. or greater. At this temperature the photopolymerizable compositions become plastic, and the polymer begins to flow. At the elevated exposure temperature, an expansion of trapped air occurs between the negative and printing plate and gas is evolved from the photopolymerizable composition. This also results in poor contact between the negative and photopolymerizable printing plate. All of the above difficulties cause poor image structure in the printing plate. There is less half-tone relief depth and generally poor reproducibility. Because of these deficiencies, plates have to be remade and there is considerable waste because of the low yield of good quality printing plates.

An object of this invention is to provide a simple, dependable apparatus for use while exposing light-sensitive elements. Another object is to provide an apparatus which maintains the temperature of such elements at a reduced level. Still another object is to provide such an apparatus which is useful during the exposure of flat or curved light-sensitive elements. Still further objects will be apparent from the following description.

The heat dissipating device of this invention comprises a narrow enclosed air passage having an inlet and an outlet, the air passage having sides, at least one of said sides being capable of transmitting actinic radiation and absorbing heat, and air blower means connected at the inlet of said air passage whereby air flows in the inlet end and out the outlet end of said passage. The heat dissipating device is used in conjunction with an apparatus for exposing light-sensitive photographic materials, e.g., photopolymerizable materials, the apparatus embodying a support for the light-sensitive material and a source of actinic radiation for exposing the material which gives off appreciable heat. The heat dissipating device is physically located between the radiation source and the light-sensitive material. The sides form an area at least substantially equal to the exposure area of the photographic material.

In the attached drawings which are a part of this application:

Figure 1:
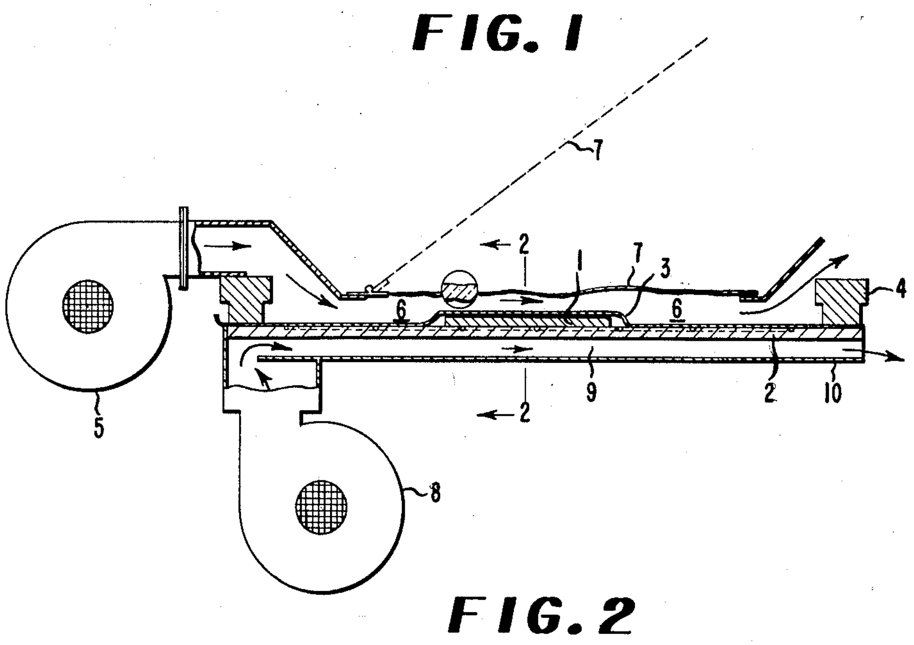
FIG. 1 is an elevation partly in section of a heat dissipating device useful during the exposure of an essentially flat, light-sensitive photographic element.

In the embodiment of the invention shown in FIGURE 1 which is useful during the exposure of flat photopolymerizable elements, a flat photopolymerizable element 1 having a photographic negative or stencil placed thereon is placed on a flat vacuum plate 2 and the system is covered completely with a vacuum cover sheet 3 capable of transmitting actinic radiation (from a source not shown), the cover sheet 3 being clamped to the vacuum plate 2 by means of a frame 4. The air in the covered frame is exhausted by means of a vacuum source (not shown) to maintain the negative or stencil in close contact with the photopolymerizable element. Blower 5 is connected to the vacuum frame assembly so that air flows (as shown) over the covered surface of the photopolymerizable element 1 within an enclosed air passage 6 formed by the vacuum cover sheet 3 and an outer shroud sheet 7. The shroud sheet 7 preferably is a polymeric film sheet which transmits actinic radiation and absorbs infra-red radiation or heat. The shroud sheet 7 is removable or can be raised as illustrated in FIGURE 1 to allow easy access to the vacuum cover sheet 3. In a preferred embodiment, a second blower 8 can be connected to the vacuum plate so that air flows into a lower passage 9 formed by the base of the vacuum plate 2 and an outer sheet 10 maintained in special relation to the vacuum plate 2. The outer sheet 10 can be impervious to actinic radiation.

Figures 2, 3:
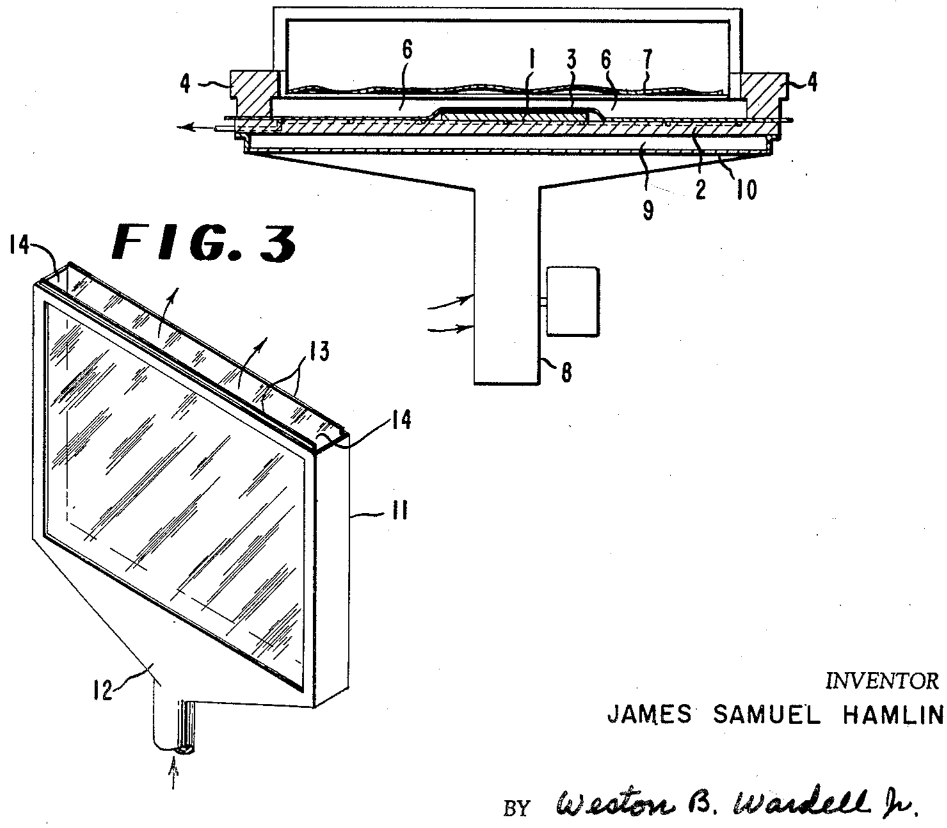
FIG. 2 is a sectional view taken along line 2—2 of FIGURE 1.
FIG. 3 is a perspective view of the heat dissipating device useful during the exposure of a curved, light-sensitive photographic element.

In another embodiment of the invention shown in FIGURE 3, which is particularly useful during the exposure of curved photopolymerizable elements e.g., on a rotary press, the heat dissipating device comprises a hollow frame 11 having a tapered inlet 12 connected to an air blower means (not shown), and an air outlet. On each side of the hollow frame is attached an ultraviolet transmitting, infrared absorbing transparent sheet 13 with which the hollow frame 11 forms an inclosed passage 14 for confining and conducting the flow of air from the air source.

In operation, the heat dissipating embodiment illustrated in FIGURES 1 and 2 forms a shroud over the photopolymerizable element to be exposed to a source of actinic radiation. The air from air blower means 5 flows through the inlet into the narrow enclosed passage 6, formed by the vacuum cover sheet 3 and the outer shroud sheet 7. The sheet 7 must transmit actinic radiation and should absorb heat (infra-red radiation). The passage 6 has an opening at the end opposite the inlet through which the air leaves the passage 6. It has been found that by using the apparatus illustrated in FIGURE 1, the photopolymerizable element is maintained at a reduced temperature, i.e., below 125° F. This is due to the air cooling the element and the outer shroud sheet 7 absorbing the infra-red radiation or heat. To further reduce the heat problem a second heat dissipating device 8–10 can be used to cool the base of the photopolymerizable element 1. The air passage walls 2 and 10 in this second device need not transmit actinic radiation.

The heat dissipating apparatus illustrated by FIGURE 3 does not come into contact with the photopolymerizable element but is placed at a predetermined point between the radiation source and the printing element. This embodiment is preferably used when exposing curved photopolymerizable elements on a rotary exposure cylinder. The rotary cylinder can be a vacuum drum which preferably has a stream of air cooling the inner surface of the cylinder to aid in cooling the base of a photopolymerizable element.

Any fan or blower of a conventional type is suitable to provide air movement. The capacity of the blower may be determined by a simple test or calculation. In general, the quantity of air will depend on the size of the enclosed area which will in turn be determined by the size of the exposure apparatus. Good quality printing plates and reusable negatives are obtained if the surface temperature of the exposed element does not exceed 125° F. In general, the velocity of air may be about 1000 feet per minute, but the velocity or volume are not critical since they depend on the above-described variables.

In an operational variation of the invention, the photopolymerizable element supported in the vacuum frame can be exposed to the actinic radiation source by moving the horizontal element into a vertical position. Generally, blower 8 is in continuous operation (between exposures) while blower 5 is activatable only when the frame is moved into the vertical position. Both of the blowers 5 and 8 may be arranged so as to be activatable only when the frame is in the vertical position. The blowers can blow the air through passages located adjacent to the top and bottom of the vacuum frame in a manner similar to that shown in FIGURES 1 and 2.

Since the photopolymerizable compositions disclosed in the Plambeck, Martin and Barney patents and the Burg application referred to above contain initiators activatable by radiation in the ultraviolet region of the spectrum, the air passage walls preferably should transmit radiation of this region. The passage walls should also absorb infra-red radiation (heat). While glass might be suitable in some instances, it does not transmit ultraviolet radiation as well as some highly polymeric films. Since the photopolymerizable elements have their greatest spectral response in the region between about 3150 A. and 3600 A. and a maximum response at about 3300 A., the preferred materials should transmit actinic radiation in this range.

Suitable such films are those composed of vinyl chloride/vinyl acetate which have a transmission of 90% in the range of from 3200 A. to 4000 A. with a transmission density of .03 to .04. They are also good absorbers of infra-red radiation. Other films comprising vinylidene chloride polymers and copolymers, acrylic polymers and polyester polymers such as those made according to Whinfield et al., U.S. 2,465,319 may be used. Polyethylene film which has a transmission of 90% in the range of from 3200 A. and a transmission density of from .06 to .07 is also quite suitable. Tetrafluoroethylene film is also useful.

The vacuum frame is of the conventional form and consists of a metal plate which is usually an aluminum plate because of its high heat conductivity and a series of grooves about 1/16 inch wide and 1/16 inch deep which form a grid pattern of about 1 inch on centers and said grooves acting as air exhausting channels which are connected by suitable means to a source of air evacuation. The surface of the metal plate of the frame should be made reflective to minimize the absorption of infra-red by the areas not covered by the negative and the printing plate being exposed. Any metal, e.g., magnesium, cast iron, stainless steel, copper, silver, can be used but aluminum is preferable because of ease of machining, high heat conduction, light weight and high surface reflection. The thickness of the metal plate of the frame is not critical but is usually of the order of about ½ inch. Metal plates of this thickness act as a heat "sponge" which absorbs the heat from the negative and polymerizable plate being printed and dissipates it to the air stream flowing over the opposite side or bottom of the frame. Cover sheet 3 is a highly flexible, gas impervious, ultraviolet transmitting infra-red absorbing transparent film which adheres closely over the frame and seals the negative and printing plate in close planar relationship when vacuum is applied to the vacuum frame. The film may have a matte finish on the surface next to the negative to also facilitate the escape of air when vacuum is applied.

Referring back to FIGURES 1 and 2, one may use in place of the blower and air conduit for cooling the under side of the vacuum frame, a liquid circulating system composed of a suitable liquid conducting means and liquid supplying and pumping means. For example, copper tubing arranged in a manifold system and attached to the bottom of the metal vacuum frame and attached to a cold water supply will provide sufficient cooling by rapidly conducting heat away from the metal base.

The invention will now be illustrated by the following examples which demonstrate the advantages of using the novel structures of the invention.

*Example I*

A photopolymerizable element made as described in Example 3 of assignee's Burg application Ser. No. 750,868, filed July 25, 1958 and having a layer thickness of 30 mils was exposed through a high-contrast negative to the intensity of a 140 amp., high intensity carbon arc. A clear vinyl chloride/vinyl acetate copolymer cover sheet was employed. The arc to plate distance was 30 inches and the exposure time was five minutes. A thermocouple placed between the negative and polymer surface registered 161° F. after the five minute exposure period. Due to the heat and the polymer softening, the negative became out of contact with the polymer surface, plugged text and halftone images, being noticed after washout.

A second exposure was made using a modified, double air-cooled vacuum frame (see FIGURE 1). The polymer surface temperature at the end of five minutes was 102° F., and the negative remained in contact with the photopolymerized layer. After washout, the printing element exhibited good image structure and printing surface.

*Example II*

A pre-curved, photopolymerizable element of the type described in Example I was mounted on an 8 inch diameter rotary exposure chuck. A high-contrast negative and clear vinyl chloride/vinyl acetate copolymer cover were placed on the element surface. After vacuum was drawn, the element was exposed to the radiation of a high intensity carbon arc lamp for 15 minutes. During the exposure, the chuck turned in the light path. The polymer surface temperature reached 140° F. and at this temperature the negative did not cooperate with the polymer surface.

A heat dissipator device, as shown in FIGURE 3, was introduced between the actinic radiation source and the printing cylinder. A second photopolymerizable element was exposed in the same manner as described above in this example. At the end of a 15 minute exposure, the temperature of the polymer surface was 108° F. The negative remained in complete cooperation with the polymer surface during exposure. After washout, the printing element exhibited good image structure and printing surface.

This invention has the advantage that by use of the inexpensive and dependable device described herein the amount of heating produced in the element and negative by exposure in standard photographic apparatus is reduced to a tolerable level without affecting the quantity of actinic radiation reaching the element being exposed. The reduction in the heat level, i.e., below 125° F., prevents the surfaces of the photopolymerizable element and photographic negative from becoming deteriorated. The reduction in heat also keeps the expansion of entrapped gases between the negative and photopolymerizable element at a minimum thereby assisting in maintaining the desired close contact between the negative and the element. If close contact is maintained, improved printing reliefs are obtained. In addition, the apparatus efficiently transmits actinic radiation while absorbing undesirable infra-red radiation.

This invention apparatus is useful during the exposure of photopolymerizable elements, particularly when the heat-generating, actinic radiating exposure source is used in close proximity with the element. While the invention has been described with respect to certain particular arrangements, it will be evident that various changes and modifications may be made without departing from the spirit and scope of the invention.

What is claimed is:

1. In an apparatus for exposing light-sensitive photographic material embodying a support for said material and a source of actinic radiation which gives off appreciable heat for exposing said material, a heat dissipating device comprising a narrow enclosed air passage having an inlet and an outlet and placed between the light-sensitive photographic material and the actinic radiation source, said air passage having flexible sides forming an area at least substantially equal to the exposure area of said photographic material, said sides capable of transmitting actinic radiation and absorbing infra-red radiation, and an air blower means connected at the inlet of said air passage whereby air flows in the inlet and out the outlet of said passage.

2. In an apparatus for exposing light-sensitive photographic material embodying a support for said material and a source of actinic radiation which gives off appreciable heat for exposing said material, a heat dissipating device comprising two narrow enclosed air passages, each of said air passages having an inlet and an outlet and having sides forming an area at least substantially equal to the exposure area of said photographic material, and air blower means connected at the inlet of each of said air passages whereby air flows in the inlet and out the outlet of said passages, one of said air passages being placed between the light-sensitive photographic material on said support and the actinic radiation source, the sides of the air passage being flexible and being capable of transmitting actinic radiation and absorbing infra-red radiation, said second air passage being attached to said device below said support, the support acting as the upper surface of said air passage.

3. In an apparatus for exposing light-sensitive photographic material embodying a support for said material and a source of actinic radiation which gives off appreciable heat for exposing said material, a heat dissipating device comprising a narrow enclosed air passage having an inlet and an outlet and placed between the light-sensitive photographic material and the actinic radiation source but not in contact with said photographic material, said air passage having flexible sides forming an area at least substantially equal to the exposure area of said photographic material, said sides capable of transmitting actinic radiation and absorbing infra-red radiation, and an air blower means connected at the inlet of said air passage whereby air flows in the inlet and out the outlet of said passage.

4. In an apparatus for exposing light-sensitive photographic material embodying a support for said material and a source of actinic radiation which gives off appreciable heat for exposing said material, a heat dissipating device comprising a narrow enclosed air passage having an inlet and an outlet and placed between a light-sensitive photographic material and the actinic radiation source, said air passage having flexible sides of a vinyl chloride/vinyl acetate copolymer forming an area at least substantially equal to the exposure area of said photographic material, said sides capable of transmitting actinic radiation and absorbing infra-red radiation, and an air blower means connected at the inlet of said air passage whereby air flows in the inlet and out the outlet of said passage.

5. In an apparatus for exposing light-sensitive photographic material embodying a support for said material and a source of actinic radiation which gives off appreciable heat for exposing said material, a heat dissipating device comprising a narrow enclosed air passage having an inlet and an outlet and placed between the light-sensitive photographic material and the actinic radiation source, said air passage having flexible sides of a vinylidene chloride polymer forming an area at least substantially equal to the exposure area of said photographic material, said sides capable of transmitting actinic radiation and absorbing infra-red radiation, and an air blower means connected at the inlet of said air passage whereby air flows in the inlet and out the outlet of said passage.

6. An apparatus as defined in claim 2 wherein said support is an aluminum plate.

References Cited in the file of this patent

UNITED STATES PATENTS

| | | |
|---|---|---|
| 2,301,675 | Arndt | Nov. 10, 1942 |
| 2,740,895 | Miller | Apr. 3, 1956 |